(12) United States Patent
Matayabas, Jr.

(10) Patent No.: US 7,060,747 B2
(45) Date of Patent: Jun. 13, 2006

(54) CHAIN EXTENSION FOR THERMAL MATERIALS

(75) Inventor: James C. Matayabas, Jr., Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 224 days.

(21) Appl. No.: 10/034,699

(22) Filed: Dec. 27, 2001

(65) Prior Publication Data

US 2002/0143092 A1 Oct. 3, 2002

Related U.S. Application Data

(63) Continuation-in-part of application No. 09/823,106, filed on Mar. 30, 2001.

(51) Int. Cl.
*C08K 3/08* (2006.01)

(52) U.S. Cl. .............. 524/439; 524/404; 524/430; 524/432; 524/437; 524/440; 524/441; 524/495; 257/706; 257/712; 257/713; 257/714; 257/789

(58) Field of Classification Search ............... 524/430, 524/432, 439, 440, 441, 404, 437, 495; 257/706, 257/712, 714, 789, 713
See application file for complete search history.

(56) References Cited

U.S. PATENT DOCUMENTS

| | | | |
|---|---|---|---|
| 4,974,119 A | | 11/1990 | Martin |
| 5,137,959 A | | 8/1992 | Block et al. |
| 5,552,635 A | * | 9/1996 | Kim et al. ............. 257/706 |
| 5,744,863 A | * | 4/1998 | Culnane et al. ........ 257/712 |
| 5,978,223 A | | 11/1999 | Hamilton et al. |
| 5,989,459 A | | 11/1999 | Nguyen et al. |
| 6,020,424 A | | 2/2000 | Osuna et al. |
| 6,054,198 A | | 4/2000 | Bunyan et al. |
| 6,096,414 A | | 8/2000 | Young |
| 6,162,663 A | | 12/2000 | Schoenstein et al. |
| 6,169,142 B1 | | 1/2001 | Nakano et al. |
| 6,188,576 B1 | | 2/2001 | Ali et al. |
| 6,204,303 B1 | | 3/2001 | Osuna et al. |
| 6,210,520 B1 | | 4/2001 | Osuna et al. |
| 6,218,730 B1 | | 4/2001 | Toy et al. |
| 6,238,596 B1 | | 5/2001 | Nguyen et al. |

FOREIGN PATENT DOCUMENTS

| | | |
|---|---|---|
| EP | 0 295 881 A | 12/1988 |
| EP | 1 167 457 A | 1/2002 |
| EP | 1 254 924 A | 11/2002 |
| FR | 2 570 383 A | 3/1986 |

* cited by examiner

*Primary Examiner*—Edward J. Cain
(74) *Attorney, Agent, or Firm*—Blakely, Sokoloff, Taylor & Zafman LLP (57) ABSTRACT

A curable material useful as thermal material comprises at least one vinyl-terminated silicone oil, at least one conductive filler, and at least one hydrogen terminated silicone oil. The hydrogen terminated silicone oil is used to reduce a shear modulus G' of the cured thermal interface material.

26 Claims, 6 Drawing Sheets

CHAIN EXTENSION FOR THERMAL MATERIALS

CROSS-REFERENCE TO RELATED APPLICATION

This is a continuation-in-part application of Application Ser. No. 09/823,106 filed Mar. 30, 2001.

BACKGROUND

1. Field of the Invention

This invention relates to thermal materials. In particular, the invention relates to controlling thermal resistance of the thermal materials.

2. Description of Related Art

In order to meet the market demand for high performance microprocessors, the recent trend in microprocessor architecture has been to increase the number of transistors (higher power), shrink processor size (smaller die), and increase clock speeds (higher frequency). These have resulted in the escalation of power dissipation as well as heat flux at the silicon die level, which increase both the raw power as well as power density on silicon.

Thermal materials have been used in packaging as interfaces between devices to dissipate heat from these devices (i.e., microprocessors). Thermal interface material (TIM) typically comprises a polymer matrix and a thermally conductive filler. The TIM technologies used for electronic packages encompass several classes of materials such as phase change materials, epoxies, greases, and gels.

Phase change materials (PCMs) are in a class of materials that undergo a transition from a solid to a liquid phase with the application of heat. These materials are in a solid state at room temperature and are in a liquid state at die operating temperatures. When in the liquid state, PCMs readily conform to surfaces and provide low thermal interfacial resistance. PCMs offer ease of handling and processing due to their availability in a film form and the lack of post dispense processing. However, from a formulation point, the polymer and filler combinations that have been utilized in PCMs restrict the bulk thermal conductivities of these materials.

Metal filled epoxies commonly are highly conductive materials that thermally cure into highly crosslinked materials. They, however, have significant integration issues with other components of the package. For example, metal filled epoxies exhibit localized phase separation within the material. This is driven by package thermo-mechanical behavior that results in high contact resistance. Furthermore, the high modulus nature of epoxies leads to severe delamination at the interfaces.

Thermal greases are in a class of materials that compared to other classes of materials offers several advantages including good wetting and ability to conform to the interfaces, no post-dispense processing, and high bulk thermal conductivity. Greases provide excellent performance in a variety of packages; however, greases cannot be used universally with all packages due to degradation of thermal performance during temperature cycling. It is observed that in some packages greases migrate out from between the interfaces under cyclical stresses encountered during temperature cycling. This phenomenon is known as "pump out". The extensive thermo-mechanical stresses exerted at the interface during temperature cycling are due to the relative flexing of the die and the thermal plate with changes in temperature. Because the pump-out phenomenon is inherently related to the formulation chemistries utilized in greases, all typical greases are subject to pump-out.

High performance, high power processors require the use of integrated heat spreaders (IHSs). The well-known thermal greases, epoxies, and phase change materials that are currently available in the market do not meet the performance requirement for packages comprising an IHS. PCMs do not possess high enough bulk thermal conductivities necessary to dissipate the high heats from the central processing units, and they typically required the use of external clamps for the application of constant positive force for optimum performance. The highly conductive metal filled epoxy thermal polymers can not be used due to their integration issues that lead to delamination and high interfacial resistance. And, greases are limited due to pump-out. To resolve these major technology barriers, highly conductive, low modulus, crosslinked gels are developed.

Gels typically comprise a crosslinkable silicone polymer, such as vinyl-terminated silicone polymer, a crosslinker, and a thermally conductive filler. Gels combine the properties of both greases and crosslinked TIMs. Before cure, these materials have properties similar to grease. They have high bulk thermal conductivities, have low surface energies, and conform well to surface irregularities upon dispense and assembly, which contributes to thermal contact resistance minimization. After cure, gels are crosslinked filled polymers, and the crosslinking reaction provides cohesive strength to circumvent the pump-out issues exhibited by greases during temperature cycling. Their modulus (E') is low enough (in the order of mega-pascal (MPa) range compared to giga-pascal (GPa) range observed for epoxies) that the material can still dissipate internal stresses and prevent interfacial delamination. Thus, the low modulus properties of these filled gels are attractive from a material integration standpoint. However, even though the modulus of the gels currently used in the industry is low, it is not low enough to survive the reliability-stressing test. The present invention provides a curable TIM that has lower modulus that meets the performance requirements of electronic packages and also survives the reliability-stressing test.

BRIEF DESCRIPTION OF THE DRAWINGS

The features and advantages of the present invention will become apparent from the following detailed description of the present invention in which.

DETAILED DESCRIPTION

In the following description, for purposes of explanation, numerous details are set forth in order to provide a thorough understanding of the present invention. However, it will be apparent to one skilled in the art that these specific details are not required in order to practice the present invention.

A rheometer (i.e., a strain-controlled rheometer) is used to monitor the curing reaction of gels and measuring the shear storage modulus G' (hereafter modulus G') of the cured gel at a curing temperature (i.e., 125° C.). During the reliability stress test, the delamination of the TIM for the IHS occurs if G' is too high (i.e., as in the case for typical epoxies). Several approaches are used to control the G' level. These approaches include controlling the ratio of reactive silicon oil vinyl ends to reactive silicone hydrate (i.e., silicone hydrogen bond (Si—H)) crosslinker sites, controlling the silicon oil molecular weight, controlling the crosslinker molecular weight, and controlling the number of Si—H crosslinking site per molecule. These approaches provide some amount of control of G', measured using any of the established well-known method.

Figure 1:
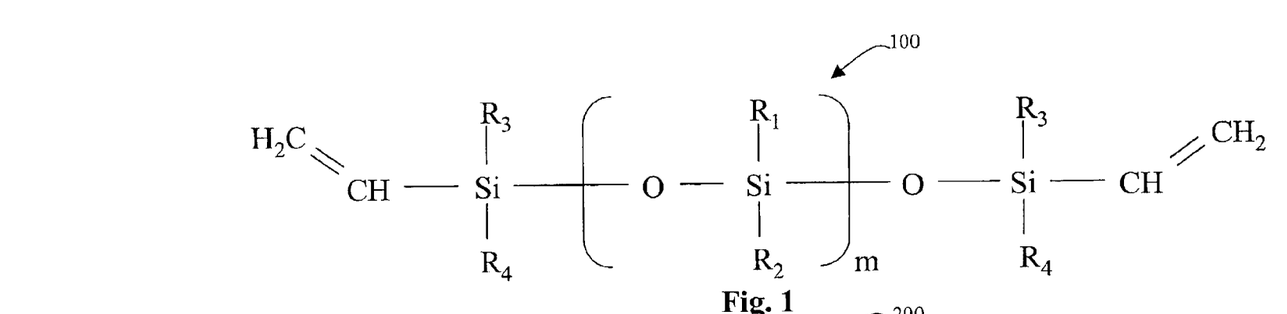
FIG. 1 is a diagram illustrating a polymer chain as one structure component in a formulation of a curable TIM according to one embodiment of the invention.

FIG. 1 is a diagram illustrating a polymer chain as one structure component in a formulation of a curable TIM according to one embodiment of the invention.

The structure component 100 is a silicone oil based composition. The structure component 100 includes at least one unit of Oxygen-Silicon (O—Si) and plurality of hydrocarbons to make up the silicon oil and vinyl groups. The O—Si group in parenthesis represents a polymer. The subscript "m" to the polymer is the degree of polymerization and represents a polymer chain of the structure component 100 where "m" is in the range of 10–1000 (i.e., when "m" is equal to 10, the average length of the polymer chain is 10). The silicone-oil base (i.e., O—Si—O—Si with hydrocarbons) when combined with vinyl (e.g., CH double bond (=) $CH_2$) form a vinyl-terminated silicone oil having the structure component 100 (where CH is methane radical and $CH_2$ is methylene radical). The vinyl groups are at the ends of the polymer chain. The vinyl-termination of the silicone oil is denoted by the symbol "$H_2C$=CH-" or "—CH=$CH_2$". The vinyl-terminated silicone oil structure (i.e., structure component 100) includes a plurality of hydrocarbons $C_1$ to $C_{26}$. These hydrocarbons are denoted by $R_1$ to $R_4$. It is contemplated that $R_1$, $R_2$, $R_3$, and $R_4$ are independently selected from $C_1$ to $C_{26}$. In other words, that $R_1$, $R_2$, $R_3$, and $R_4$ can be selected to be the same or to be different from aliphatic, cycloaliphatic, and aromatic hydrocarbons comprising 1 to 26 carbon atoms. In one embodiment, silicone oil is vinyl terminated poly (dimethyl siloxane) (i.e., component 100 where $R_1$, $R_2$, $R_3$, and $R_4$ are methyl ($C_1$)).

Figure 2:
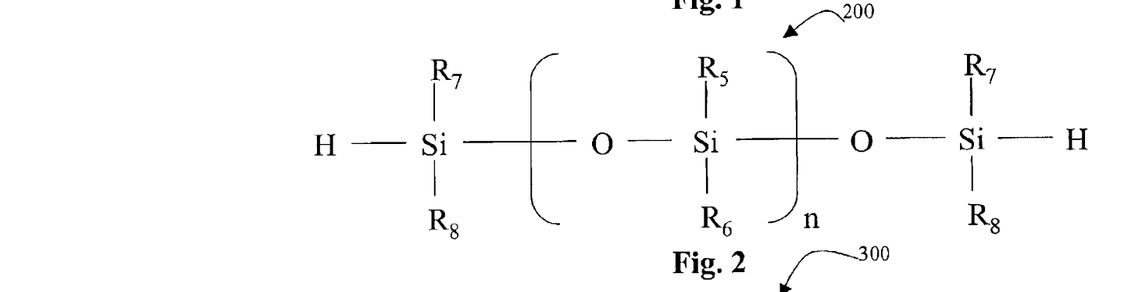
FIG. 2 is a diagram illustrating a chain extender as one structure component in the formulation of the curable TIM according to one embodiment of the invention.

FIG. 2 is a diagram illustrating a chain extender as one structure component in the formulation of the curable TIM according to one embodiment of the invention.

The structure component 200 (e.g., chain extender) includes a silicone oil based material, which is represented by the parenthesis with the subscript "n" (where "n" is the degree of polymerization) and Si—H/H—Si (silicone hydrate) at two ends of the silicone oil (e.g., O—Si—O—Si—O—Si, etc., chain structure). The chain extender or structure component 200 may be long or short depending on the number of polymer (O—Si) composition used in the structure. In other words, the degree of polymerization of the chain extender "n" used can range from approximately 10 to approximately 10,000. The structure component 200 (H-terminated silicone oil) may be used as a chain extender for the polymer chain described in FIG. 1. The two hydrogen (H) components are located at the two ends of the silicone oil based material (O—Si—O—Si chain). The chain extender also includes a plurality of hydrocarbons $C_1$ to $C_{26}$, which are denoted by $R_5$ to $R_8$. The $R_5$, $R_6$, $R_7$, and $R_8$ components are independently selected from the $C_1$ to $C_{26}$ hydrocarbons group. In one embodiment, the chain extender is hydrogen terminated poly (dimethyl siloxane) (i.e., component 200 where $R_5$, $R_6$, $R_7$, and $R_8$ are methyl ($C_1$)). The chain extender is combined with the vinyl-terminated silicone oil to control the modulus (i.e., shear modulus G') of TIMs (gels).

Generally, the TIM has two key functions. One function is to dissipate heat and the other function serves as a material that absorbs stresses. The stresses on the TIM are due to the mismatches coupling expansion of different materials (i.e., die and metal) since these materials have different coefficients of thermal expansion. The TIM between the die and metal receives stresses exerted from the die and metal. It is observed that TIMs with chain extender have a reduced modulus (i.e., shear modulus G') and thus are better able to absorb these stresses without delaminating from the surfaces. It is also observed that TIMs with chain extender have reduced thermal interfacial resistance and are therefore better able to conduct heat.

Figure 3:
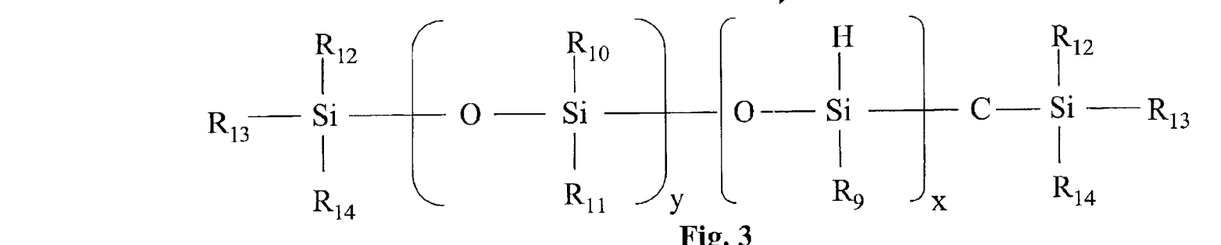
FIG. 3 is a diagram illustrating a crosslinker as one structure component in the formulation of the curable TIM according to one embodiment of the invention.

FIG. 3 is a diagram illustrating a crosslinker as one structure component in the formulation of the curable TIM according to one embodiment of the invention.

Figure 4:
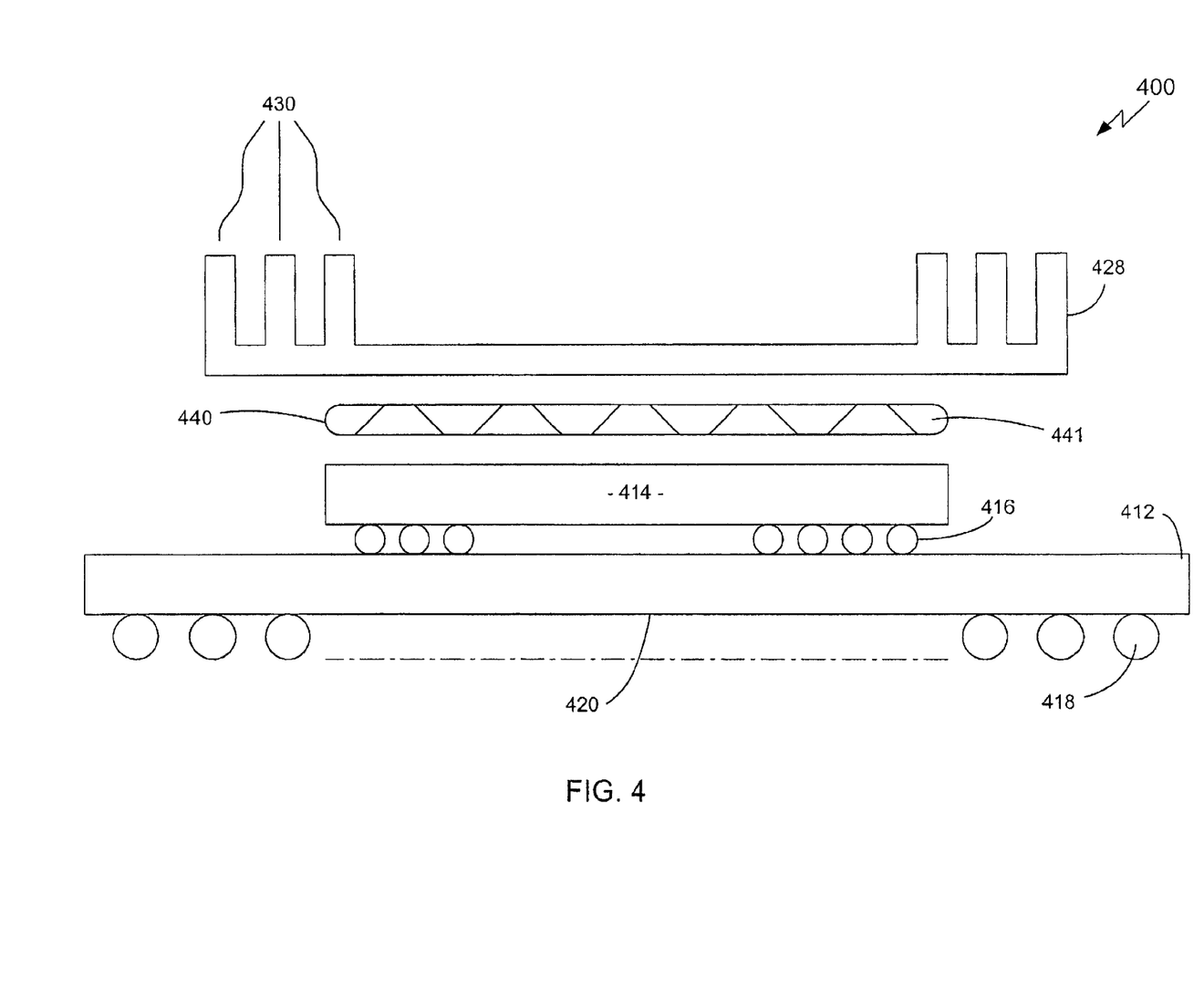
FIG. 4 is a diagram illustrating an integrated circuit package in which one embodiment of the invention can be practiced.

The silicone crosslinker structure 300 includes at least one polymer unit (shown in parenthesis with a subscript "y"), at least one crosslinkable unit (shown in bracket with a subscript "x"), silicone and a plurality of hydrocarbons $C_1$ to $C_{26}$, which are denote by $R_9$ to $R_{14}$. $R_9$ to $R_{14}$ and are independently selected from the hydrocarbons $C_1$ to $C_{26}$ group. In one embodiment, $R_1$ to $R_{14}$ are all methyl ($CH_3$). The subscripts "x" and "y" represent the degrees of polymerization where "x" is in the range of 3–100 and "y" is in the range of 10–10,000. The crosslinker 300 when combined with the vinyl terminated silicone oil together with other additives form a basic formulation of gel TIM (as shown in FIG. 4). This gel TIM has low modulus; however, the modulus is not low enough to meet the needs for high performing processors. Therefore, a gel TIM that includes structure components 100, 200 and 300 together with other additives is formed to produce a curable TIM that has a reduced modulus (i.e., modulus G').

In one embodiment, the composition of curable TIM includes at least one vinyl-terminated silicone oil having the structure 100, at least one H-terminated silicone oil having the structure 200, and at least one thermally conductive filler. The composition of curable TIM further includes at least one silicone crosslinker having the structure 300. In this case (i.e., the structure 300 is combined with structures 100, 200 and the thermally conductive filler), the ratio of the chain extender of structure 200 to the crosslinker of structure 300 is controlled such that mole fraction of Si—H equivalents from the chain extender to the total Si—H equivalents from both the crosslinker and the chain extender in the formulation is in the range of 0.1 to 1. In one embodiment, this ratio is approximately 0.6. It is contemplated that the formula may contain more than one chain extender and/or crosslinker. The crosslinker 300 in the formulation comprises a plurality of silicone hydride (Si—H) units. The chain extender 200 comprises two Si—H units. As stated earlier, these two Si—H units are located at the two ends of the polymer chain. The chain extender 200 helps reduce the number of crosslinks in the curable TIM. This results in the reduction of the shear modulus G' that reduces the thermal resistance due to the TIM. With low resistance in the package, the device (i.e., central processing unit (CPU)) can operate at faster speed since the TIM with low resistance can get more heat out from the device. It is contemplated that reducing shear G' modulus in the TIM also reduces other moduli (i.e., modulus E') since these moduli are related. The chain extender may be used with any kind of polymer chains. Silicone thermal gel material is by far more commonly used since it has lower shear modulus G' than epoxy gel materials (modulus of these material are extremely high and are not commercially used). However, with the chain extender, the shear modulus G' in the silicone thermal gels can be reduced further.

The gel TIM formulation includes at least one vinyl-terminated silicone oil (i.e., structure 100), at least one Si—H crosslinker and a Pt catalyst. After cure, this Gel TIM formulation has a low modulus G'. However, the G' in this formulation may not be low enough to meet the needs of high performance processors. The crosslinker and the silicone oil are combined to develop a network structure. The G' value obtained after cure depends on the average distance between the crosslink sites. The average distance between the crosslink sites depends upon the values "y" and "x" for the crosslinker (i.e., structure 300), the value of "m" for the silicone oil (i.e., structure 100), and the ratio of crosslinker to silicone oil (i.e., the Si—H to Si-vinyl ratio). To make the distance between the crosslink sites longer without raising the viscosity (i.e., without increasing the value of "m" in structure 100 and "y" in structure 300), chain extender (i.e., structure 200) is used. In one embodiment, the chain extender is approximately the size as the crosslinker (i.e., the value of "n" in structure 200 is about the same as the sum of the values of "y" and "x" in structure 300).

The crosslinkable TIM may be formulated by mixing the components together to produce a gel which may be applied by dispensing methods to any particular surface and cured at a certain temperature (i.e., room temperature). The Gel TIM formulation includes at least one vinyl-terminated silicone oil (i.e., structure 100), at least one H-terminated silicone oil (e.g., chain extender or structure 200), at least one silicone crosslinker (i.e., Si—H crosslinker or structure 300), and at least one thermally conductive filler (not shown). These structure components are combined together to form a low modulus G' Gel TIM formulation. The order of the compositions that are combined together is not critical to the formation of the TIM. Of course other additive such as catalysts for the curing reaction are included in the compositions. The ratio of Si—H equivalents from the chain extender to the Si—H equivalents from the crosslinker is adjusted such that it would yield a desired modulus G' value.

The crosslinking reaction that occurs during cure involves the formation of a silicone-carbon bond by reaction of the vinyl group with the silicone hydride group. It is noted that it is well known to those skilled in the art that the Si—H to Si-vinyl molar ratio is a critical formulation parameter for controlling the properties of the silicone matrix after cure. However, a wide range of values can be used in the practice of this invention. The value of Si—H to Si-vinyl ratio is in the range of about 2 to 0.6. The use of Si—H to Si-vinyl values outside this range may result in materials that have G' values outside of the desired range. In one embodiment, the Si—H to Si-vinyl ratio is approximately 1.0.

Since the chain extension technology forms linear, high molecular weight silicone polymers during cure, the base silicone oil can have a wide range of molecular weights. However, silicone oils with low molecular weights are desirable because lower molecular weight silicone oils provide TIMs with improved processibility due to their reduced viscosity before cure. Moreover, the use of low molecular weight silicone oil provides improved wetting of fillers due to reduced entropy loss upon becoming confined to the surface of the filler and permits higher filler loadings, which provide higher bulk thermal conductivities.

A filler is needed in the compositions of the structures shown in FIG. 1 and FIG. 2 or in the composition of structure shown in FIGS. 1, 2, and 3. Although the filler selection and weight percent in the formulation are key parameters for the performance of thermal interface materials, these parameters are well understood by those skilled in the art and are not critical to the practice of this invention. Therefore, a wide variety of fillers and filler loadings can be used in the practice of this invention. Examples of these fillers include metals, such as aluminum, silver, copper, and the like; ceramics, such as aluminum nitride, aluminum oxide, zinc oxide, boron nitride, aluminum nitride, and the like; silver coated aluminum, carbon fibers, alloys and any combinations thereof.

Similarly, a wide variety of filler average particle sizes and particle size distributions can be used in the practice of this invention. Fillers with larger average filler sizes provide higher bulk thermal conductivities; however, they also give higher bond line thicknesses that reduce thermal performance. Therefore, the average particle size must be selected in a range that balances these factors for a high performance thermal interface material. Typically, the average particle size is less than about 300 microns. In one embodiment, the average particle size is less than approximately 30 microns.

Gel TIMs comprising chain extension technology can be cured over a wide range of temperatures and/or times. The cure time and temperature can be controlled by the choices of catalyst selection, catalyst concentration, and the optional use of catalyst inhibitors and retarders, known to those skilled in the art. In general, the chain extenders react more quickly than typical silicone crosslinkers, and, therefore, typically require modifications of the catalyst selection, concentration, inhibitors, etc. in order to provide a balance of reactivity during cure and sufficiently long shelf life and pot life.)

In addition, the compositions of this invention may also contain other additives including, but not limited to, catalysts for the curing reaction, coupling agents for the filler, adhesion promoters, coloring agents, and other additives know to those skilled in the art.)

The compositions of this invention may be used as thermal interface materials in electronic packages that require the removal of heat. The packages may have a variety of form factors including pin grid arrays, ball grid arrays, and ball grid arrays with pinned interposers. The compositions are especially useful as the thermal interface material between the die and the IHS of flip-chip packages; however, they can be used in a variety of applications which a thermal interface material is needed between the chip and the heat removal hardware such as heat fins, fans, vapor chambers, and the like.

FIG. 4 is a diagram illustrating an integrated circuit package 400 in which one embodiment of the invention can be practiced.

In one embodiment, the integrated circuit package 400 includes a substrate 412 electrically coupled to an integrated circuit 414 by solder bumps 416 utilized in a process commonly referred to as controlled collapsed chip connection (C4). Although solder bumps 416 are shown and described, it is understood that the integrated circuit 414 may be connected to the substrate 412 by other means such as bond wire.

The integrated circuit package 400 may include a plurality of solder balls 418 that are attached to a bottom surface 420 of the substrate 412. The solder balls 418 may be reflowed to attach the integrated circuit package 400 to a printed circuit board (not shown). The substrate 412 may contain routing traces, surface pads, power/ground planes and vias, etc., which electrically connect the solder balls 418 with the solder bumps 416. Although solder balls 418 are shown and described, it is to be understood that the package 400 may have other contacts such as pins.

The integrated circuit 414 generates heat, which must be removed from integrated circuit package 400. A thermal element 428 may be thermally coupled to integrated circuit 414 to facilitate the removal of heat from the integrate circuit 414. The thermal element 428 may be a heat sink, which has a plurality of fins 430. To decrease the thermal impedance between the integrated circuit 414 and the thermal element 428, retaining structure 440 may be impregnated with curable TIM 441 in accordance with the invention to form a heat pipe, where the heat pipe may then be placed between the integrated circuit 414 and the thermal element 428. The curable TIM 441 used may be a composition that includes structure elements 100 and 200 or the composition may include structure elements 100, 200, and 300, and other additives.

Figure 5:
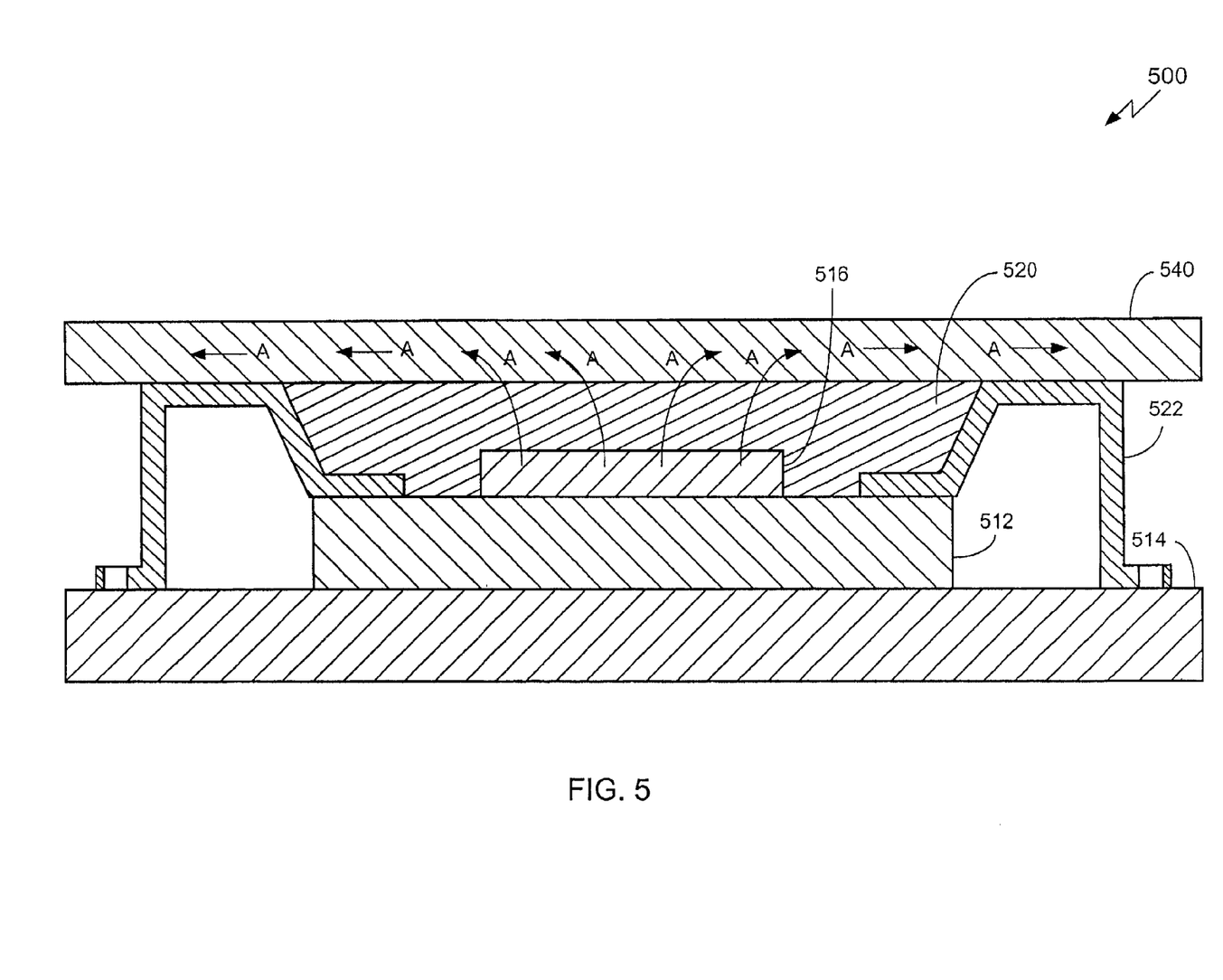
FIG. 5 is a diagram illustrating an integrated circuit package in which another embodiment of the invention can be practiced.

FIG. 5 is a diagram illustrating a microprocessor assembly 500 in which another embodiment of the invention can be practiced.

The microprocessor assembly 500 includes a printed circuit board (PCB) 512 that is mounted to a substrate 514 and a thermal plate 540. The microprocessor assembly 500 also includes a processor die 516, which is mounted to the PCB 512. The processor die 516 is an integrated circuit that is the processing core of the microprocessor assembly 500. The microprocessor assembly 500 further includes a thermal top cover 522 and a thermal plate 540.

A curable thermal interface material 520 in accordance with the invention is used as thermal material between the processor die 516 and the thermal plate 540 (as shown). The curable TIM 520 may be applied by a dispensing machine. The curable TIM 520 used may be a composition that includes structure elements 100 and 200 or the composition may include structure elements 100, 200, and 300, and other additives (as described above).

In one embodiment, the thermal plate 540 is disposed above the PCB 512 and processor die 516 and is provided for cooling the various electrical components of the microprocessor assembly 500. The thermal plate 540 performs this function by dissipating heat along its entire surface. As shown in FIG. 5, heat is transferred from the processor die 516 to the thermal plate 540 along the thermal path indicated by the arrows A. In this embodiment, the thermal plate 540 is formed of aluminum.

Figure 6:
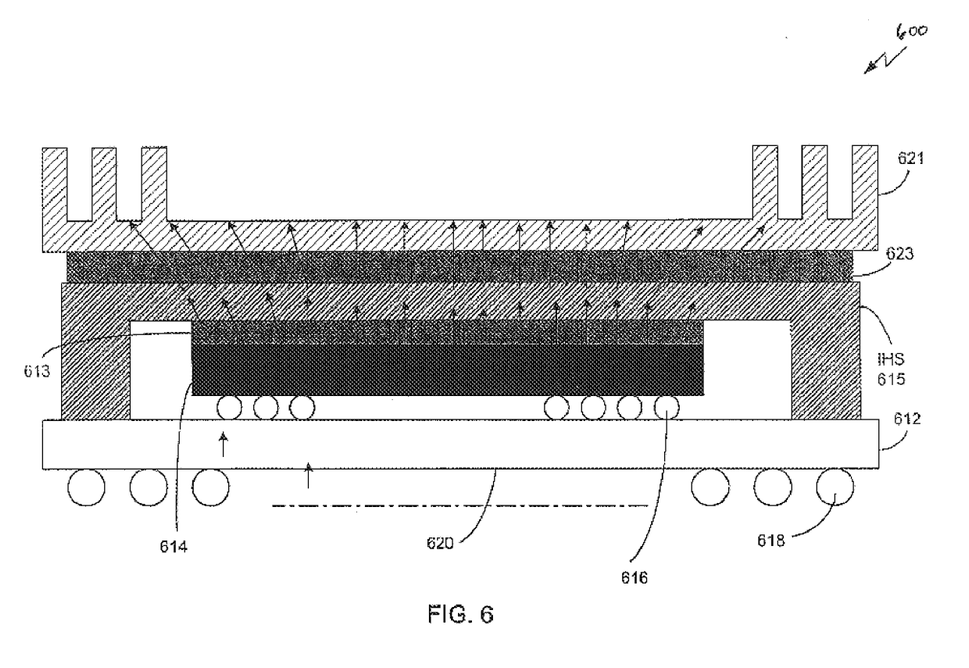
FIG. 6 is a diagram illustrating an integrated circuit package in which another embodiment of the invention can be practiced.

FIG. 6 is a diagram illustrating an integrated circuit package 600 in which one embodiment of the invention can be practiced.

In one embodiment, the integrated circuit package 600 includes a substrate 612 electrically coupled to an integrated circuit 614 by solder bumps 616 utilized in a process commonly referred to as controlled collapsed chip connection (C4). A curable TIM 613 is used as thermal material between the integrated circuit or die 614 and an integrated heat spreader (IHS) 615. The integrated circuit package 600 may include a plurality of solder balls 618 that a re attached to a bottom surface 620 of the substrate 612.

The integrated circuit 614 generates heat, which must be removed from integrated circuit package 600. The integrated heat spreader 615 may be thermally coupled to integrated circuit 614 to facilitate the removal of heat from the integrated circuit 614. The heat spreader 615 may comprise metal and metal alloys optionally with a coating of another metal or may comprise a thermally conductive composite material. To decrease the thermal impedance between the integrated circuit 614 and the heat spreader 615, curable TIM 613 may be placed between the integrated circuit 614 and the heat spreader 615. The curable TIM 613 used may be a composition that includes structure elements 100 and 200 or the composition may include structure elements 100, 200, and 300, and/or other additives.

Further, thermal element 621 maybe thermally coupled to heat spreader 615 to further facilitate the removal of heat. The thermal element 621 may be a heat sink, which has a plurality of fins. To decrease the thermal impedance between the integrated circuit 614 and the thermal element 621, another thermal interface material 623 is applied and be placed between the heat spreader 615 and the thermal element 621. The thermal interface material 623 may be the same or different from the curable TIM 641. In one embodiment, thermal interface material 623 may be a composition that includes structure elements 100 and 200 or the composition may include structure elements 100, 200, and 300, and other additives. In another embodiment, thermal interface material 623 may be a thermal grease. In yet another embodiment, thermal interface material 623 may be a phase change material.

Figure 7:
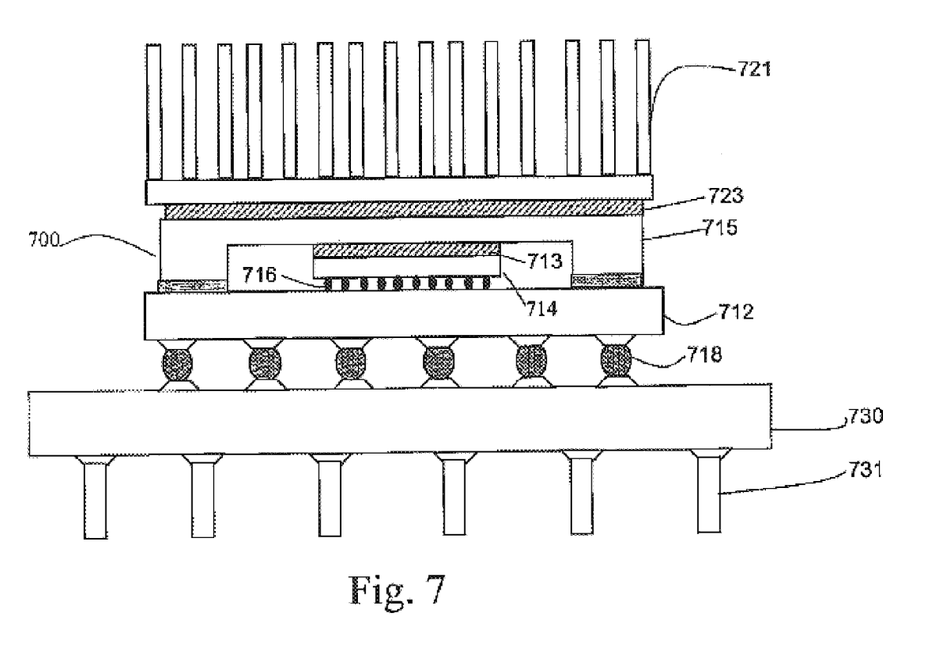
FIG. 7 is a diagram illustrating an integrated circuit package in which another embodiment of the invention can be practiced.

FIG. 7 is a diagram illustrating an integrated circuit package 700 in which one embodiment of the invention can be practiced.

In one embodiment, the integrated circuit package 700 includes a substrate 712 electrically coupled to an integrated circuit 714 by solder bumps 716 utilized in a process commonly referred to as controlled collapsed chip connection (C4). A curable TIM 713 is used as thermal material between the integrated circuit or die 714 and an integrated heat spreader (IHS) 715. The integrated circuit package 700 may be electrically coupled to an interposer 730 by solder bumps 718 utilized in a process commonly referred to as surface mounting connection (SMT). The interposer 730 may include a plurality of pins 731.

The integrated circuit 714 generates heat, which must be removed from the integrated circuit package 700. The integrated heat spreader 715 may be thermally coupled to integrated circuit 714 to facilitate the removal of heat form the integrate circuit 714. The heat spreader 715 nay comprise metal and metal alloys optionally with a coating of another metal or may comprise a thermally conductive composite material. To decrease the thermal impedance between the integrated circuit 714 and the heat spreader 715, curable TIM 713 in accordance with the invention may be placed between the integrated circuit 714 and the heat spreader 715. The curable TIM 713 may be a composition that includes structure elements 100 and 200 or the composition may include structure elements 100, 200, and 300, and/or other additives.

Further, thermal element 721 may be thermally coupled to heat spreader 715 to further facilitate the removal of heat. The thermal element 721 may be a heat sink, which has a plurality of fins. To decrease the thermal impedance between the integrated circuit 714 and the thermal element 721, another thermal interface material 723 in accordance with the invention is applied and be placed between the heat spreader 715 and the thermal element 721. The thermal interface material 723 may be the same or different from the curable TIM 713. In one embodiment, thermal interface material 723 may be a composition that includes structure elements 100 and 200 or the composition may include structure elements 100, 200, and 300, and other additives. In another embodiment, thermal interface material 723 may be a thermal grease. In yet another embodiment, thermal interface material 723 may be a phase change material.

Figure 8:
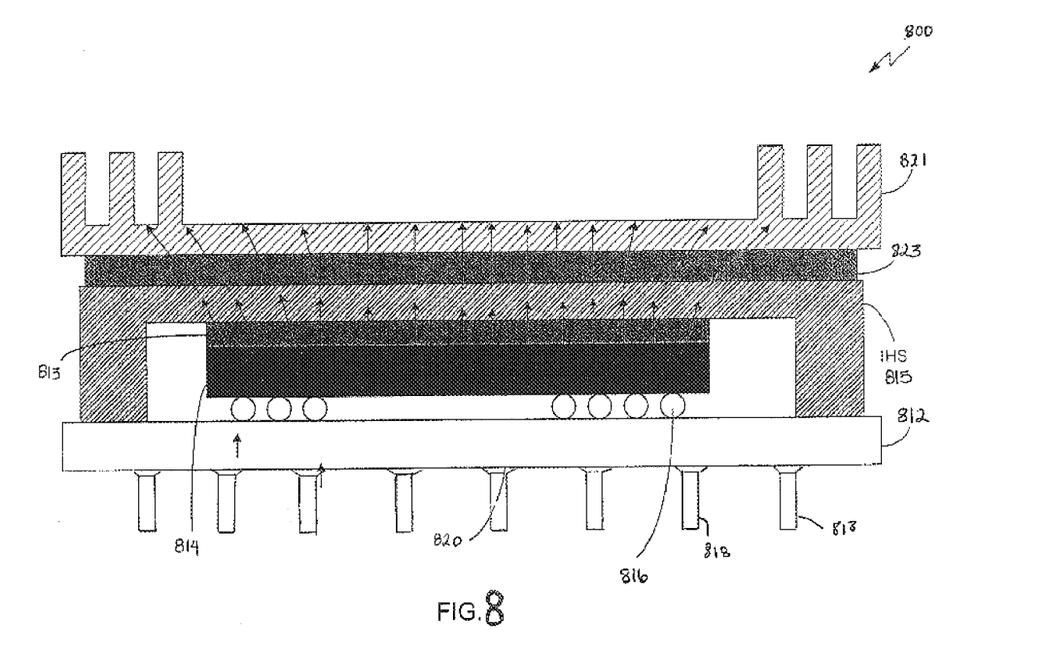
FIG. 8 is a diagram illustrating an integrated circuit package in which another

FIG. 8 is a diagram illustrating an integrated circuit package 800 in which one embodiment of the invention can be practiced.

The integrated circuit package 800 includes a substrate 812 electrically coupled to an integrated circuit 814 by solder bumps 816 utilized in a process commonly referred to as controlled collapsed chip connection (C4). A curable TIM 813 is used as thermal material between the integrated circuit or die 814 and an integrated heat spreader (IHS) 815. The integrated circuit package 800 may include a plurality of pins 818 that are attached to a bottom surface 820 of the substrate 812.

The integrated circuit 814 generates heat, which must be removed from integrated circuit package 800. The integrated heat spreader 815 may be thermally coupled to integrated circuit 814 to facilitate the removal of heat from the integrated circuit 814. The heat spreader 815 may comprise metal and metal alloys optionally with a coating of another metal or may comprise a thermally conductive composite material. To decrease the thermal impedance between the integrated circuit 814 and the heat spreader 815, curable TIM 813 may be placed between the integrated circuit 814 and the heat spreader 815. The curable TIM 813 used may be a composition that includes structure elements 100 and 200 or the composition may include structure elements 100, 200, and 300, and/or other additives.

Further, thermal element 821 may be thermally coupled to heat spreader 815 to further facilitate the removal of heat. The thermal element 821 may be a heat sink, which has a plurality of fins. To decrease the thermal impedance between the integrated circuit 814 and the thermal element 821, another thermal interface material 823 is applied and be placed between the heat spreader 815 and the thermal element 821. The thermal interface material 823 may be the same or different from the curable TIM 841. In one embodiment, thermal interface material 823 may be a composition that includes structure elements 100 and 200 or the composition may include structure elements 100, 200, and 300, and other additives. In another embodiment, thermal interface material 823 may be a thermal grease. In yet another embodiment, thermal interface material 823 may be a phase change material.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. A composition comprising:
   at least one vinyl-terminated silicone oil;
   at least one conductive filler;
   at least one hydrogen terminated silicone oil; and
   at least one silicone crosslinker to form a gel thermal interface material with low modulus, the silicone crosslinker is a random co-polymer comprising at least three silicone-hydrogen bonds (Si—H), the composition being a curable and thermally conductive material.

2. The composition of claim 1 wherein a mole fraction of equivalents of silicone hydrogen bond (Si—H) provided by the hydrogen terminated silicone oil to a total equivalents of Si—H provided by both the silicone crosslinker and the hydrogen terminated silicon oil is at least 0.4.

3. The composition of claim 1 wherein a molar ratio of Si—H equivalents to Si-vinyl equivalents is in a range of approximately 2 to 0.6.

4. The composition of claim 3 wherein the ratio is approximately 1.

5. The composition of claim 1 wherein the conductive filler is one of aluminum, silver, copper, aluminum nitride, aluminum oxide, zinc oxide, boron nitride, aluminum nitride, silver coated copper, silver coated aluminum, and carbon fibers, and alloys and mixture thereof.

6. The composition of claim 1 wherein the conductive filler has a particle size of less than 300 microns.

7. A composition comprising:
   at least one vinyl-terminated silicone oil;
   at least one conductive filler;
   at least one hydrogen terminated silicone oil;
   at least one catalyst for curing reaction; and
   at least one coupling agent for the filler, the composition being a curable and thermally conductive material.

8. A composition comprising:
   at least one vinyl-terminated silicone oil;
   at least one conductive filler;
   at least one hydrogen terminated silicone oil;
   at least one catalyst for curing reaction; and
   at least one adhesion promoter, the composition being a curable and thermally conductive material.

9. A method comprising:
   combining at least one vinyl-terminated silicon oil, at least one conductive filler, and at least one hydrogen terminated silicone oil to form a curable thermal interface material (TIM); and
   combining a silicone crosslinker to form a gel thermal interface material with low modulus, the silicone crosslinker is a random co-polymer comprising at least three silicone-hydrogen bonds (Si—H).

10. The method of claim 9 wherein a mole fraction of equivalents of silicone hydrogen bond (Si—H) provided by the hydrogen terminated silicone oil to a total equivalents of Si—H provided by both the silicone crosslinker and the hydrogen terminated silicon oil is at least 0.4.

11. The method of claim 9 wherein a molar ratio of equivalents silicone-hydrogen bonds (Si—H) to equivalents of silicon-vinyl bonds (Si-vinyl) is in a range of approximately 2 to 0.6.

12. The method of claim 9 wherein the ratio is approximately 1.0.

13. The method of claim 9 wherein the conductive filler is one of aluminum, silver, copper, aluminum nitride, aluminum oxide, zinc oxide, boron nitride, aluminum nitride, silver coated copper, silver coated aluminum, carbon fibers, alloys and mixtures thereof.

14. The method of claim 9 further comprising combining at least one catalyst for curing reaction.

15. The method of claim 14 further comprising combining at least one coupling agent for the filler.

16. The method of claim 14 further comprising combining at least one adhesion promoter.

17. A processor assembly comprising:
   a semi conductor device;
   a heat spreader coupled to the semiconductor device;

a first curable thermal material between the semiconductor device and the heat spreader to provide thermal resistance, the first curable thermal material comprising:
  at least one vinyl-terminated silicone oil,
  at least one conductive filler, and
  at least one hydrogen terminated silicone oil,
a thermal element coupled to the heat spreader; and
a second curable thermal material between the heat spreader and the thermal element, the second curable thermal material comprising:
  at least one vinyl-terminated silicone oil,
  at least one conductive filler, and
  at least one hydrogen terminated silicone oil,
the first and second curable material further comprises at least one silicone crosslinker to form a gel thermal interface with low modulus, the silicone crosslinker is a random co-polymer comprising at least three silicone-hydrogen bonds (Si—H).

18. The processor assembly of claim 17 further comprising:
  a substrate coupled to the semiconductor device; and
  an interposer coupled to the substrate.

19. The processor assembly of claim 18 further comprising:
  a first plurality of solder bumps coupling the substrate to the semiconductor device; and
  a second plurality of solder bumps coupling the semiconductor device to the substrate.

20. The processor assembly of claim 18 further comprising:
  a plurality of pins extending outwardly from the interposer.

21. The processor assembly of claim 17 wherein a mole fraction of equivalents of silicone hydrogen bond (Si—H) provided by the hydrogen terminated silicone oil to a total equivalents of Si—H provided by both the silicone crosslinker and the hydrogen terminated silicone oil is at least 0.4.

22. The processor assembly of claim 17 wherein a molar ratio of Si—H equivalents to Si-vinyl equivalents is in a range of approximately 2 to 0.6.

23. The processor assembly of claim 17 further comprising:
  a substrate coupled to the semiconductor device; and
  a plurality of pins extending outwardly from the substrate.

24. The composition of claim 1, wherein the plurality of silicone-hydrogen bonds (Si-H) of the silicone crosslinker comprises at least three silicone- hydrogen bonds (Si-H).

25. The method of claim 9, wherein the plurality of silicone-hydrogen bonds (Si-H) of the silicone crosslinker comprises at least three silicone-hydrogen bonds (Si-H).

26. The processor assembly of claim 17, wherein the plurality of silicone-hydrogen bonds (Si-H) of the silicone crosslinker comprises at least three silicone- hydrogen bonds (Si-H).

* * * * *